United States Patent [19]

Marchand et al.

[11] Patent Number: 4,500,848
[45] Date of Patent: Feb. 19, 1985

[54] FIELD EFFECT TRANSISTOR MICROWAVE AMPLIFIER

[75] Inventors: Maurice Marchand; Yan Haëntjens, both of Boulogne Billancourt, France

[73] Assignee: LMT Radio Professionnelle, Billancourt, France

[21] Appl. No.: 409,852

[22] Filed: Aug. 20, 1982

[30] Foreign Application Priority Data

Aug. 25, 1981 [FR] France ................ 81 16215

[51] Int. Cl.³ .................. H03G 3/10; H03F 3/16
[52] U.S. Cl. ................................. 330/285; 330/277
[58] Field of Search ............... 330/277, 279, 285, 300, 330/310

[56] References Cited

U.S. PATENT DOCUMENTS 3,714,601  1/1973  Minton et al. ............... 330/285
4,229,707  10/1980  Suganuma ..................... 330/285
4,338,572  7/1982  Schürmann ................... 330/285
4,366,450  12/1982  Suganuma ..................... 330/300

Primary Examiner—James B. Mullins
Assistant Examiner—G. Wan
Attorney, Agent, or Firm—Cushman, Darby and Cushman

[57] ABSTRACT

In a microwave preamplifier of a Doppler radar system used for Earth observation, three pre-matched and self-biassed field effect microwave transistors are provided. By supplying these transistors by means of a voltage regulator, whose output voltage varies under the action of a control circuit, the gain of this pre-amplifier may be varied without modifying the standing wave ratio, thereby obtaining modulation of the microwave signal amplified by the amplifier. Thus, additional modulation may be obtained, speech modulation for example, on the transmission signal of an Earth observation Doppler radar system.

4 Claims, 1 Drawing Figure

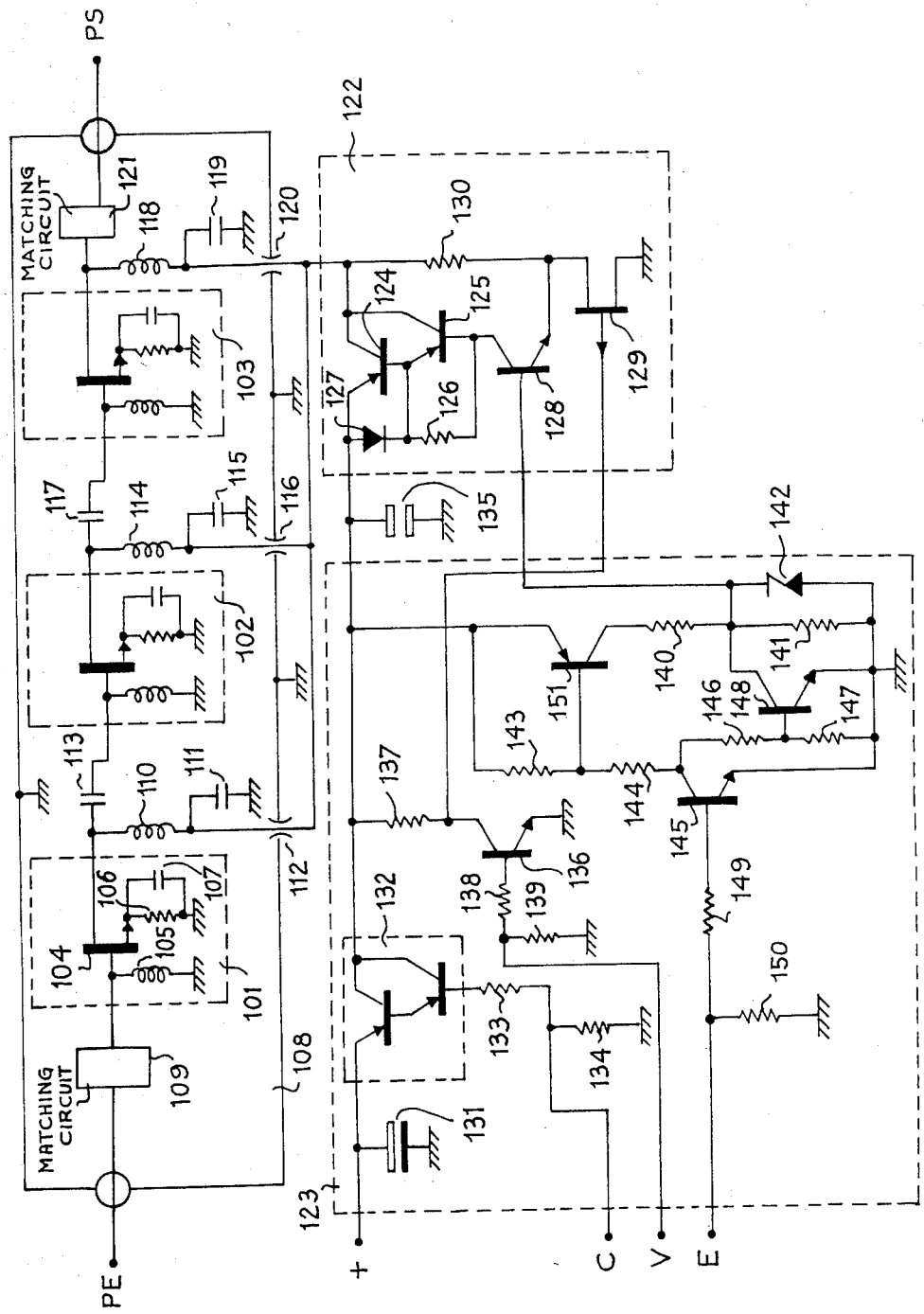

FIELD EFFECT TRANSISTOR MICROWAVE AMPLIFIER

BACKGROUND OF THE INVENTION

The present invention relates to field effect transistor microwave amplifiers for amplifying a microwave signal without using a vacuum tube. These microwave amplifiers are more often used in Doppler radar systems and more particularly still in those for Earth observation, for which efforts are made to eliminate the vacuum tubes so as to reduce the weight, the space taken up and the power consumption.

The use of transistors is known, particularly field effect transistors, for amplifying microwaves, in particular in the so-called I band, which ranges at about 10 GHz. These transistors are generally formed from gallium arsenide. They can only operate as class A amplifiers, which results in a constant and fairly high power consumption. Economy in power consumption, which might be expected by using transistors instead of vaccum tubes, is thus very much reduced, since tubes are capable of operating as class C amplifiers, with an average smaller power consumption taking into account, on the one hand, the intrinsic efficiency of class C amplifiers with respect to class A amplifiers and, on the other hand, a generally low filling rate when they are used for pulsed operation (case of radars).

BRIEF SUMMARY OF THE INVENTION

The invention provides therefore a microwave amplifier for a Doppler radar system which comprises:
an input matching circuit for receiving an input signal to be amplified;
at least one prematched and self biassed field effect transistor whose standing wave ratio is substantially constant with a variable supply voltage, connected to the input matching circuit;
an output matching circuit connected to the transistor for delivering the amplified output signal;
an adjustable voltage regulator for supplying the transistor with a variable voltage, which modifies the gain of the amplifier.

BRIEF DESCRIPTION OF THE DRAWING

Other features and advantages of the invention will appear clearly from the following description given by way of a non-limiting example with reference to the accompanying drawing which shows an amplifier in accordance with the invention.

DETAILED DESCRIPTION OF THE INVENTION

The microwave amplifier shown in the drawing, uses as active microwave components three field effect transistors 101 to 103. These transistors are known commercially under the reference THC 9311-9312, and comprise in fact gallium arsenide transistor such as 104, which is provided with elements for prematching and self biassing. These elements comprise a shock inductance 105 which connects the gate of the transistor to ground and a biassing resistor 106 which connects the source to ground and which is shunted by a decoupling capacitor 107. These elements, as well as the conductors connecting the transistor to the output terminals of the case, in which it is delivered, provide very simple mounting since no external biassing element is required and a minimum of external elements for matching to the circuits in which it is mounted are required.

These three transistors are mounted in a microwave structure 108, formed by a known technique by means of a metal block in which cavities are hollowed out receiving the different members, while insulating the stages from each other so that the only connection is made by connections passing through the walls located between these cavities through adequate apertures.

The first amplification stage 101 is driven by an input signal PE which is applied to the gate of the first transistor 101 through a matching circuit 109, which is not shown in detail in the drawing. The matching circuit essentially comprises, in a well known way, an impedance transformer for matching the relatively low impedance of the gate of the transistor to the higher one of the external circuits which drive the transistor and whose value is, according to current microwave practice, for example 50 ohms.

The source resistor 106 of transistor 101 is connected to the mass of structure 108 and the drain of transistor 101 is supplied with DC current through a load inductance 110 decoupled to ground through a decoupling capacitor 111 and a by-pass capacitor 112. Inductance 110 is illustrated in the drawing as a coil but, taking into account the frequencies used, it is of course in the form of a distributed constant line, similarly to the other inductances of the circuit.

The output of this first stage is taken from the drain of transistor 101 and is connected to the gate of transistor 102 through a connecting capacitor 113.

This second stage is connected, similarly to the first one, by a load inductance 114, a decoupling capacitor 115 and a by-pass capacitor 116. It is connected to the third stage through a connecting capacitor 117.

This third stage is itself fed by a load inductance 118, a decoupling capacitor 119 and a by-pass capacitor 120.

The output of the microwave amplifier is taken from the drain of transistor 103 through a matching circuit 121, represented in block form in the drawing for the sake of simplicity, but formed in accordance with current microwave techniques like circuit 109. This matching circuit delivers an output signal PS.

To supply the three microwave amplification stages, the invention proposes using a voltage regulator 122, itself controlled by a control circuit 123.

The regulator comprises a ballast transistor 124 whose emitter receives a positive supply voltage of about 10 volts from the control circuit 123 and whose collector delivers the regulated supply voltage to the three load impedances 110, 114 and 118.

Transistor 124 is connected in a Darlington circuit by means of a transistor 125 whose emitter is connected to the base through a resistor 126.

The emitter of transistor 124 is connected to its own base through a biassing diode 127.

The base of transistor 125 is also connected to the collector of a transistor 128 whose emitter is connected to ground through the drain-source circuit of a field effect transistor 129.

The base of transistor 128 receives a reference voltage, and the gate of transistor 129 a control voltage.

The emitter of transistor 128 is also connected to the collector of transistor 124 through a resistor 130.

The circuit thus formed provides a relatively conventional regulator, but whose output voltage is adjustable by modifying the control voltage applied to the gate of transistor 129, which acts as a variable resistor. Further-more, by suppressing or establishing the reference voltage, the output voltage of the regulator may be cut off or established in an extremely short time which does not exceed a few tens of nanoseconds, if the speed for cutting off or establishing this reference voltage is of course sufficient.

The control circuit comprises a filtering capacitor 131 which is supplied by the supply voltage. This filtering capacitor is connected to the supply input of regulator 122 through a transistor 132 of the integrated Darlington type. The base of transistor 132 is connected to ground through series resistors 133 and 134.

The common point between these resistors is connected to an input connection of the control circuit which may receive a cut-off signal C for disabling transistor 132 and thus cutting off the supply to the microwave amplifier when a fault is detected, for example by means of an outside circuit. The supply connection between circuits 122 and 123 is moreover shunted to ground by a capacitor 135, which allows the output voltage of circuit 123 to be filtered.

The control circuit 123 also comprises a transistor 136 fed from the output of transistor 132 by a resistor 137 connected to its collector. Its emitter and its base are connected to ground, directly for the emitter and through two series resistors 138 and 139 for the base.

The common point between these two resistors 138 and 139 is connected to an input connection of the control circuit 123, which may receive an analog control signal V. This signal is therefore amplified by transistor 136 and is to be found with the opposite phase and an adequate level at the collector thereof. It is then applied from this collector to the gate of the field effect transistor 129 of regulator 122. The resistance offered by the drain-source circuit of this transistor 129 varies therefore as a function of the variations of the control signal V. Thus, the voltage supplying the microwave amplifier stages of the amplifier may be varied in accordance with the variations of this signal V.

The inventors have in fact discovered that in such a circuit, using more especially the above-mentioned microwave transistors, the standing wave ratio of the assembly varied very little with the supply voltage whereas the gain varied very significantly.

Thus, the output signal PS from the amplifier may be modulated quite simply and practically without unmatching this amplifier.

Thus, the gain may be varied by 10 decibels which corresponds to an amplitude modulation of 30%, while keeping a standing wave ratio between 1.5 and 2. The frequency band in which this result was obtained extended from 9.3 to 9.9 GHz and the maximum total gain was 23 decibels at 9.6 GHz, providing an output level of 14 decibels-milliwatts with a consumption of 100 milliamps and a sufficient signal PE at the input.

The cut-off signal C causes the total supply of the device to be cut off if, for example, a malfunction is detected. The speed of this cut-off is not very great, because of, in large part, the filtering capacitor 135. To then be able to modulate the amplifier by all or nothing and to cause it to operate in a pulsed manner, whereas the modulation due to signal V maintains the continuous wave operation, the control circuit further comprises means for applying to the base of transistor 128 a reference voltage able to be cut off in response to a digital control signal E.

These means comprise a transistor 151, whose emitter is supplied from the collector of transistor 132 and whose collector is connected to ground through two series resistors 140 and 141. Resistor 141 is shunted by a Zener diode 142, which supplies a stabilized reference voltage to the base of transistor 128.

The base of transistor 151 is connected to its emitter by a resistor 143 and to the collector of a transistor 145 by a resistor 144.

The emitter and the collector of transistor 145 are connected to ground, the first directly and the second through two series resistors 146 and 147. The common connection to these two resistors is connected to the base of a transistor 148 whose emitter is grounded and whose collector is connected to the cathode of Zener diode 142.

The base of transistor 145 is connected to ground through two series resistors 149 and 150.

The digital control signal E is applied to an input terminal of circuit 123 which is connected to the common point between resistors 149 and 150.

Thus, a digital control signal, compatible for example with TTL circuits, applied to this input E causes the reference voltage applied to regulator 122 to vary between a zero value and the reference value properly speaking, while reproducing the variations of this digital signal. The microwave amplifier thus operates in a pulsed manner, but the signal within these pulses remains in class A. In the above digital example, a rise and release time for the microwave pulses is obtained in less than 100 nanoseconds.

The microwave amplifier thus described may be used, for example in a Doppler radar system for observing the Earth, as a pre-amplifier before the power transmitter. In this case, three modulating means may be used, which may be combined together, depending on the desired results.

The first modulating means consists in applying as microwave signal PE to be amplified a signal formed from pulses with any filling rate. When this filling rate is 100%, it is clear that we then have a pure continuous signal.

The second modulating means consists in applying a digital signal to the input E of the control circuit. This allows the consumption of the amplifier to be reduced, for example, when the signal PE is formed of pulses, by enclosing these pulses by means of the signal E, which cuts off the supply and so the output of transistors 101 to 103, outside the desired microwave pulses.

The third modulating means consists in applying to input V an analog signal which may for example be speech modulation. This modulation is superimposed for example on the modulation of the radar and may then allow speech transmission to other radars situated in the same observation zone, or to receivers carried by specially equipped vehicles.

Signal V may also correspond to an automatic gain control signal obtained from a measurement of the level of the signal transmitted by the radar. Another application of such an AGC signal consists in using the amplifier as a low power multi-channel transmitter. By using the AGC signal the passband is regularized and it is possible for example with a gain control of 10 decibels to have a transmitter able to operate in a 600 MHz band centered on 9.6 GHz.

What is claimed is:

1. A microwave amplifier for Doppler radar, comprising:
   an input matching circuit for receiving an input signal to be amplified;

at least one pre-amplifier stage connected to said input matching circuit, said at least one pre-amplifier stage having a self-biassed field effect transistor whose standing wave ratio is substantially constant under a variable supply voltage;

an output matching circuit connected to said at least one pre-amplifier stage for delivering the amplified output signal; and an adjustable voltage regulator for supplying said at least one pre-amplifier stage with a variable voltage which modifies the gain of the amplifier, said voltage regulator comprising: a transistor operating as a variable resistor, depending on the signal received at its gate, for regulating the output voltage of the regulator; and an amplifier for receiving an analog modulation signal and applying this amplified signal to the gate of the transistor operating as a variable resistor.

2. An amplifier as claimed in claim 1, wherein the voltage regulator comprises an input for receiving a reference voltage and which further comprises: a circuit for generating the reference voltage; and a means for cancelling the reference voltage under the control of a digital modulation signal.

3. An amplifier as claimed in claim 2, which further comprises means for supplying the voltage regulator with a primary regulated voltage, said supplying means further allowing the primary regulated voltage to be cut off under the control of a cut-off signal.

4. An amplifier as claimed in claim 3, which comprises three series connected pre-amplifier stages, said self-biassed field effect transistors being of the THC 9311-9312 type.

* * * * *